United States Patent
Sasaki et al.

(10) Patent No.: US 7,265,703 B2
(45) Date of Patent: Sep. 4, 2007

(54) PIPELINED ANALOG-TO-DIGITAL CONVERTER HAVING INTERLEAVED SAMPLE-AND-HOLD CIRCUITS COUPLED IN COMMON

(75) Inventors: Fumiyasu Sasaki, Takasaki (JP); Eiki Imaizumi, Kodaira (JP); Takanobu Anbo, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/197,586

(22) Filed: Aug. 5, 2005

(65) Prior Publication Data

US 2006/0044172 A1 Mar. 2, 2006

(30) Foreign Application Priority Data

Sep. 2, 2004 (JP) ............................. 2004-255299

(51) Int. Cl.
*H03M 1/38* (2006.01)
(52) U.S. Cl. ...................... 341/161; 341/122; 341/155
(58) Field of Classification Search ................ 341/156, 341/118, 120, 161, 172, 122, 155; 250/208.1, 250/214; 348/222.1, 241, 294, 308; 358/539; 327/94

See application file for complete search history.

(56) References Cited

U.S. PATENT DOCUMENTS

| | | | | |
|---|---|---|---|---|
| 5,710,563 A * | 1/1998 | Vu et al. | ..................... | 341/161 |
| 5,990,820 A * | 11/1999 | Tan | ............................. | 341/161 |
| 6,124,820 A * | 9/2000 | Norman | ...................... | 341/161 |
| 6,184,809 B1 * | 2/2001 | Yu | .............................. | 341/120 |
| 6,304,204 B1 * | 10/2001 | Norman | ...................... | 341/161 |
| 6,362,770 B1 * | 3/2002 | Miller et al. | ................. | 341/172 |
| 6,369,744 B1 * | 4/2002 | Chuang | ...................... | 341/161 |
| 6,480,132 B1 * | 11/2002 | Yoshioka et al. | ........... | 341/155 |
| 6,686,957 B1 * | 2/2004 | Johnson et al. | .......... | 348/222.1 |
| 6,744,395 B1 * | 6/2004 | Perelman et al. | ........... | 341/161 |
| 6,753,913 B1 * | 6/2004 | Bilhan et al. | ............... | 348/241 |
| 6,756,929 B1 * | 6/2004 | Ali | ............................. | 341/161 |
| 6,778,126 B2 * | 8/2004 | Ali | ............................. | 341/156 |
| 6,784,814 B1 * | 8/2004 | Nair et al. | ................... | 341/118 |
| 6,839,009 B1 * | 1/2005 | Ali | ............................. | 341/118 |
| 6,870,495 B1 * | 3/2005 | Zadeh et al. | ................ | 341/161 |
| 6,881,942 B2 * | 4/2005 | Huang et al. | ............ | 250/208.1 |

(Continued)

FOREIGN PATENT DOCUMENTS

JP 8-337989 12/1996

(Continued)

*Primary Examiner*—Linh Nguyen
(74) *Attorney, Agent, or Firm*—Mattingly, Stanger, Malur & Brundidge

(57) ABSTRACT

A semiconductor integrated circuit device provided with a pipeline A-D conversion circuit in which the enhancement of accuracy and the reduction of power consumption are accomplished is provided. The pipeline A-D conversion circuit is connected in series with an input terminal to which an analog signal to be converted is inputted and has a plurality of stages. The stages other than the first stage connected with the input terminal through at least one stage, including the first stage that receives input signals from the input terminal are constructed as follows: each of the other stages is comprised of two or more sample and hold circuits and an amplifier connected in common with the two or more sample and hold circuits. The two or more sample and hold circuits are caused to perform interleave operation.

6 Claims, 17 Drawing Sheets

U.S. PATENT DOCUMENTS 6,972,707 B1 * 12/2005 Anthony .................... 341/172
6,980,148 B1 * 12/2005 Bahai ........................ 341/161
7,012,559 B1 * 3/2006 Pan et al. .................. 341/161
7,064,700 B1 * 6/2006 Garrity et al. ............. 341/155
2002/0039076 A1 * 4/2002 Soenen ...................... 341/156

FOREIGN PATENT DOCUMENTS

JP      2000-013232      1/2000

* cited by examiner

PIPELINED ANALOG-TO-DIGITAL CONVERTER HAVING INTERLEAVED SAMPLE-AND-HOLD CIRCUITS COUPLED IN COMMON

CROSS-REFERENCE TO RELATED APPLICATION

The present application claims priority from Japanese patent application No. 2004-255299 filed on Sep. 2, 2004, the content of which is hereby incorporated by reference into this application.

BACKGROUND OF THE INVENTION

1. Field of the Invention

The present invention relates to a semiconductor integrated circuit device and more particularly to a technology effectively utilized, for example, for a preprocessing LSI (AFE: Analog Front End) for a camera provided with Pipelined A-D conversion circuit.

2. Description of Related Art

Pipeline A-D conversion circuits are disclosed, for example, in Japanese Unexamined Patent Publication No. Hei 08 (1996)-337989 and in Japanese Unexamined Patent Publication No. 2000-013232.

[Patent Document 1] Japanese Unexamined Patent Publication No. Hei 08 (1996)-337989

[Patent Document 2] Japanese Unexamined Patent Publication No. 2000-013232

SUMMARY OF THE INVENTION

Based on Patent Document 1 above, the pipelined A-D conversion circuit illustrated in FIG. 20 was considered prior to the invention as claimed in the application concerned. The A-D converter in FIG. 20 is a pipelined A-D converter (hereafter, referred to as "ADC") of nine-stage construction. The first stage STG1 and the last stage STG9 have a resolution of 3 bits, and the other stages STG2 to STG8 have a resolution of 1.5 bits. Each stage comprises a sub-ADC and a sample-and-hold amplifier (hereafter, referred to as "S/H amplifier). The S/H amplifiers are responsible for the functions of D/A converter (hereafter, referred to as "DAC") subtracter, and double gain amplifier. Input is converted into a digital signal by the sub-ADC1 in the first stage STG1. Its output is the digital output of the first stage, and further the higher-order 1.5 bits are also used as input to the sub-DAC1 in the first stage STG1. A residual signal obtained by subtracting the output of the DAC1 from the input to the ADC1 is amplified and doubled, and is passed to the second stage STG2. The lower-order 1.5 bit output of the sub-ADC1 in the first stage STG1 is passed to the second stage STG2, and is used as input to the sub-DAC in the second stage STG2.

In the second stage STG2, the result of conversion of the signal amplified at the first stage STG1 into the digital signal by the sub-ADC2 is passed to an output circuit. This also makes input to the DAC3 in the third stage STG3. To the sub-DAC2 in the second stage STG2, the lower-order 1.5 bits of the output of the sub-ADC1 in the first stage STG1 are inputted. A residual signal obtained by subtracting the output of the sub-DAC2 from the amplifier output of the first stage STG1 is amplified and doubled, and is passed to the third stage STG3. The same operation as in the second stage STG2 is performed in the third and following stages, and the output of ADCs are sequentially determined from higher-order bits. Since the last stage STG9 need not pass a signal to the next stage, it is composed only of a 3-bit sub-ADC. In ordinary pipelined ADCs, the output of each sub-ADC is inputted to the sub-DAC in the same stage. In the above method, meanwhile, the input to the sub-DAC in each stage is determined by the sub-ADC in the preceding stage. Thus, the timing of DAC-subtracter-amplifier portions can be separated from the timing of the sub-ADCs; therefore, the critical path is shortened, and speed enhancement can be accomplished.

Based on Patent Document 2 above, the pipelined A-D conversion circuit illustrated in FIG. 21 was considered prior to the invention as claimed in the application concerned. With respect to the ADC illustrated in FIG. 20, the first stage STG1 and the last stage STG9 are of 3 bits, and the stages between them are of 1.5 bits. In the ADC in FIG. 21, all the stages are of n bits, and each stage is so constructed that it has two sets of sub-DACs and two sets of S/H amplifiers. The ADCs perform interleave operations in which, when either S/H amplifier is performing a sampling operation, the other performs a holding operation. Thus, the speed of amplifiers is mitigated, and lowering of power is accomplished.

One of means for enhancing the accuracy by the ADC technology described in Patent Document 1 is to increase the number of pipelined stages. By adding another stage, the accuracy can be enhanced by one bit. However, there is a problem. Increase in the number of pipelined stages leads to increased power consumption. Another method is to enhance the resolution per stage; however, this case also involves a problem. Since the load capacity of amplifiers is increased, it is required to increase the consumption current of amplifiers for ensuring speed. To reduce power consumption, it is required to reduce the amplifier current, which accounts for a large percentage of the power consumption of ADCs. This involves speed reduction. According to the ADC technology described in Patent Document 2, all the stages are provided with two sets of S/H circuits and two sets of DACs. Interleave operations occur in which, when either is performing a sampling operation, the other performs a holding operation is performed. Thus, the speed of amplifiers is mitigated, and lowering of power is accomplished. However, interleave operations involve problems. Since two types of signal paths are created, a difference is produced between their outputs due to variation in element or the like, and this degrades the accuracy.

An object of this invention is to provide a semiconductor integrated circuit device provided with a pipelined A-D conversion circuit in which high accuracy and low power consumption are accomplished. The above and other objects and novel features of this invention will be apparent from the description in this specification and accompanying drawings.

The following is a brief description of the gist of the representative elements of the invention disclosed in this application: a semiconductor integrated circuit device is provided with a pipelined A-D conversion circuit that is series-connected with an input terminal to which analog signals to be converted are inputted and has a plurality of stages. The stages other than the first stage connected with the input terminal through at least one stage, including the first stage that receives input signals from the input terminal, are constructed as follows: each of the other stages is comprised of two or more sample and hold circuits and amplifiers connected in common with the two or more sample and hold circuits. The two or more sample and hold circuits are caused to perform interleave operations.

High accuracy can be maintained and power consumption can be reduced by interleave operations limited to downstream stages in which accuracy is not required.

DETAILED DESCRIPTION OF THE PREFERRED EMBODIMENTS

Figure 1:
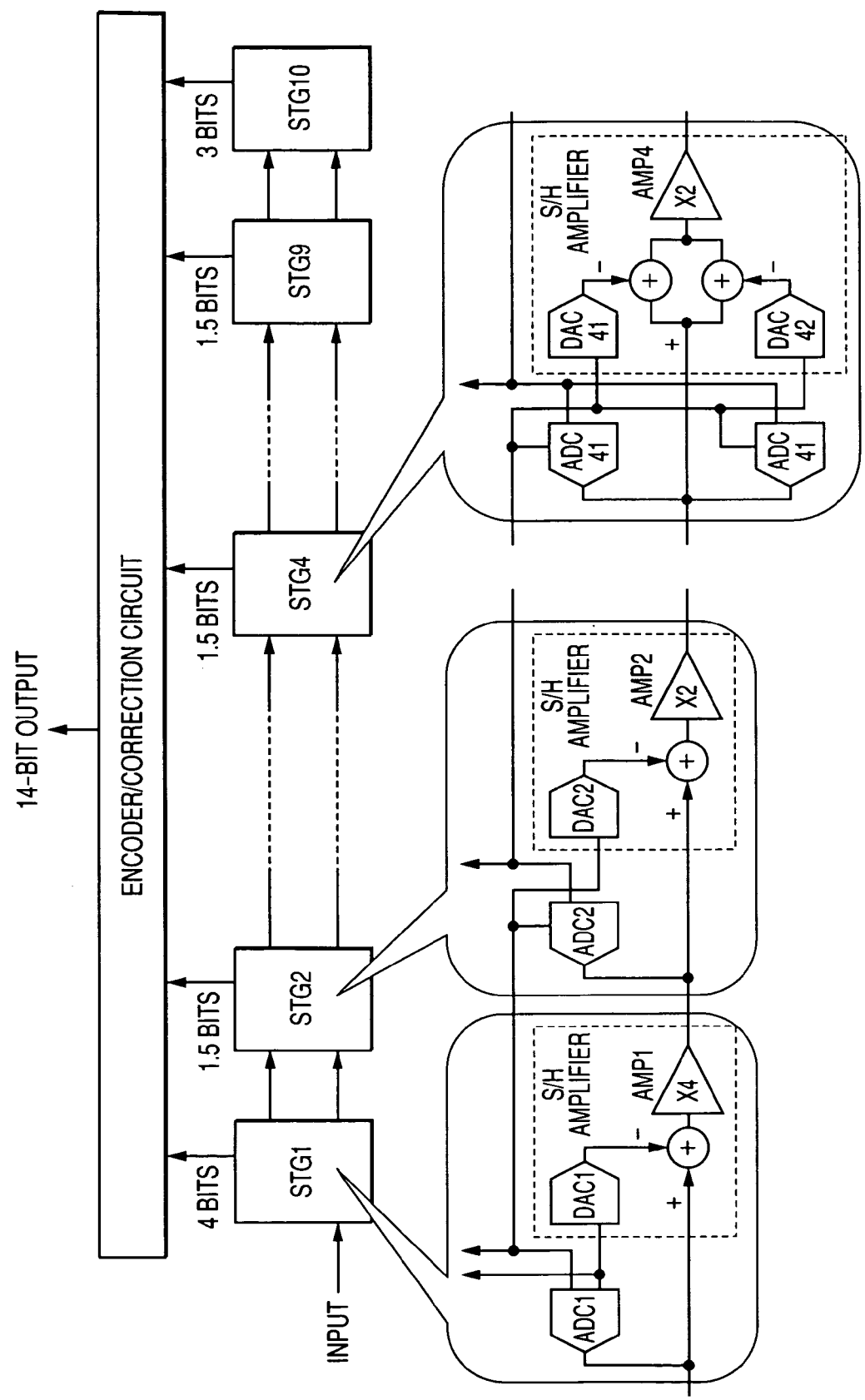
FIG. 1 is a block diagram illustrating an embodiment of a pipelined A-D converter according to this invention.

FIG. 1 is a block diagram illustrating an embodiment of a pipelined A-D converter according to this invention. The A-D converter in this embodiment is an ADC of 10-stage construction. The first stage STG1 has a resolution of 4 bits; the last stage STG10 has a resolution of 3 bits; and the other stages STG2 to STG9 have a resolution of 1.5 bits. Each stage consists of a sub-ADC and an S/H amplifier. Like the stage STG1 illustrated in the figure as an example, the S/H amplifiers are responsible for the functions of DAC, subtracter, and quadruple gain amplifier. Like the stage STG2 or STG4 illustrated in the figure as an example, they are responsible for the functions of DAC, subtracter, and double gain amplifier. Input is converted into a digital signal by the sub-ADC1 in the first stage STG1. Its output makes the digital output of the first stage STG1. Further, the higher-order 2.5 bits of the 4-bit output are inputted to the sub-DAC1 in the first stage, and the lower-order 1.5 bits are inputted to the sub-DAC2 in the second stage. Further, they are inputted to the sub-ADC2 in the second stage, and a reference corresponding to this digital value is selected. A residual signal obtained by subtracting the output of the DAC1 from the input to the sub-ADC1 is amplified and quadrupled, and is passed to the second stage STG2.

The second stage STG2 passes the result of conversion of the signal amplified at the first stage STG1 into a digital signal by the sub-ADC2 to an output circuit. This also makes input to the DAC3 in the third stage STG3. To the sub-DAC2 in the second stage STG2, the lower-order 1.5 bits of the output of the sub-ADC1 in the first stage STG1 are inputted. A residual signal obtained by subtracting the output of the sub-DAC2 from the amplifier output of the first stage STG1 is amplified and doubled, and is passed to the third stage STG3. The same operation as in the second stage STG2 is performed in the third and following stages, and the output of ADCs are sequentially determined from higher-order bits. Since the last stage STG9 need not pass a signal to the next stage, it is composed only of a 3-bit sub-ADC. The output signals of the stages STG1 to STG10 are inputted to an encoder/correction circuit, from which a digital signal comprising 14 bits is outputted.

In ordinary pipelined ADCs, the output of each sub-ADC is inputted to the sub-DAC in the same stage. In a pipelined A-D converter in this embodiment, meanwhile, the input to the sub-DAC in each stage is determined by the sub-ADC in the preceding stage. As described later with reference to FIG. 9, selection of a desired reference voltage for the sub-ADC in each stage is determined by the sub-ADC in the preceding stage. Thus, the timing of DAC-subtracter-amplifier portions can be separated from the timing of the sub-ADCs; therefore, the critical path is shortened, and speed enhancement can be accomplished. This embodiment is a pipelined ADC of 10-stage construction. As mentioned above, the first stage STG1 is of 4 bits; the second to ninth stages STG2 to STG9 are of 1.5 bits; and the last stage STG10 is of 3 bits. The fourth stage STG4 and the following stages are interleaved. In interleaving, in general, a plurality of signal paths, for example, ADC41 and ADC42 and DAC41 and DAC42, are created; therefore, a difference is produced between the outputs of the paths due to variation in element or the like, and this degrades the accuracy. As mentioned above, however, the fourth stage STG4 and the following stages are interleaved, and thus degradation in accuracy due to variation in elements or the like can be made negligible.

Figure 2:
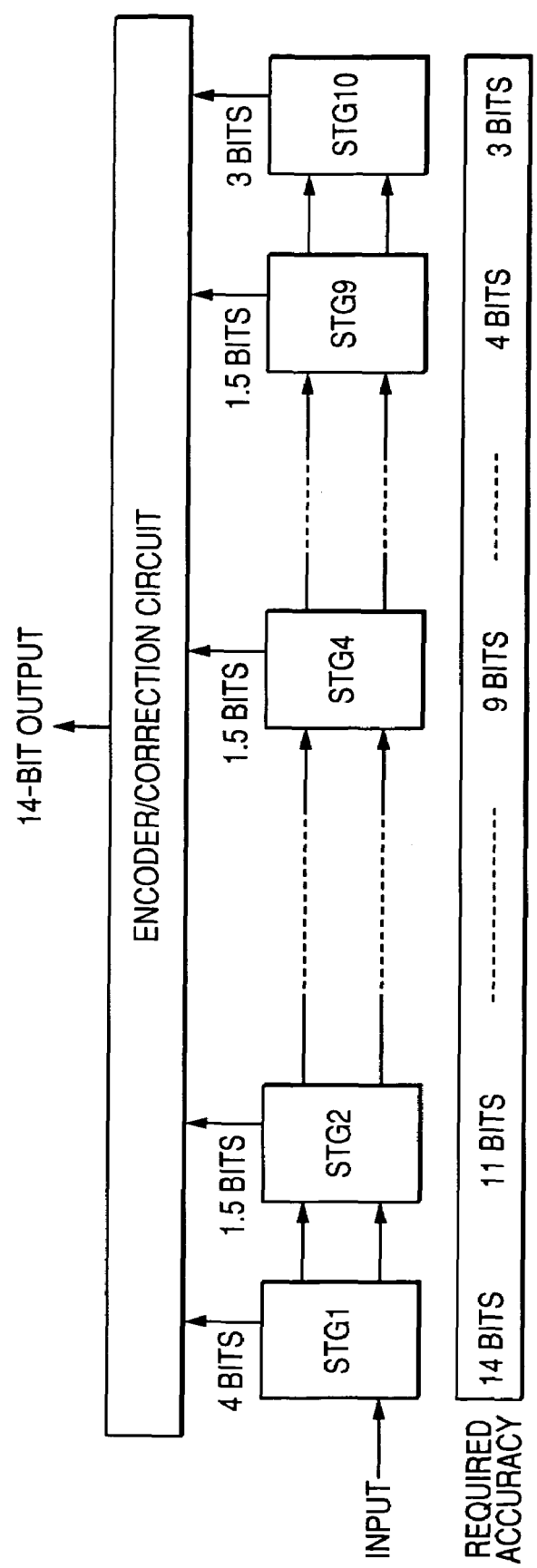
FIG. 2 is an explanatory drawing explaining the accuracy required in each stage of the ADC illustrated in FIG. 1.

FIG. 2 is an explanatory drawing explaining the required accuracy in each stage with the 14-bit ADC in FIG. 1 taken as an example. As illustrated in the figure, the required accuracy is lowered in more downstream stages. More specific description will be given. In the first stage STG1, an accuracy of 14 bits is required. In the second stage STG2, the higher-order 4 bits are removed, and thus the accuracy is lowered to 11 bits. Hereafter, the accuracy is lowered in decrements of 1.5 bits as the stage goes downstream. In the fourth stage STG4, as mentioned above, the accuracy can be reduced to so low a value as 9 bits. Only the fourth stage STG4 and the following stages where the accuracy requirement is mitigated are interleaved. Thus, degradation in accuracy is avoided and the power consumption is lowered. In the first stage STG1 to the third stage STG3 where bit accuracy is required, degradation in accuracy due to variation in element or the like has influence. In these stages, therefore, interleaving is avoided, and priority is given to accuracy. Thus, both high accuracy and low power consumption can be accomplished at the same time.

Figure 3:
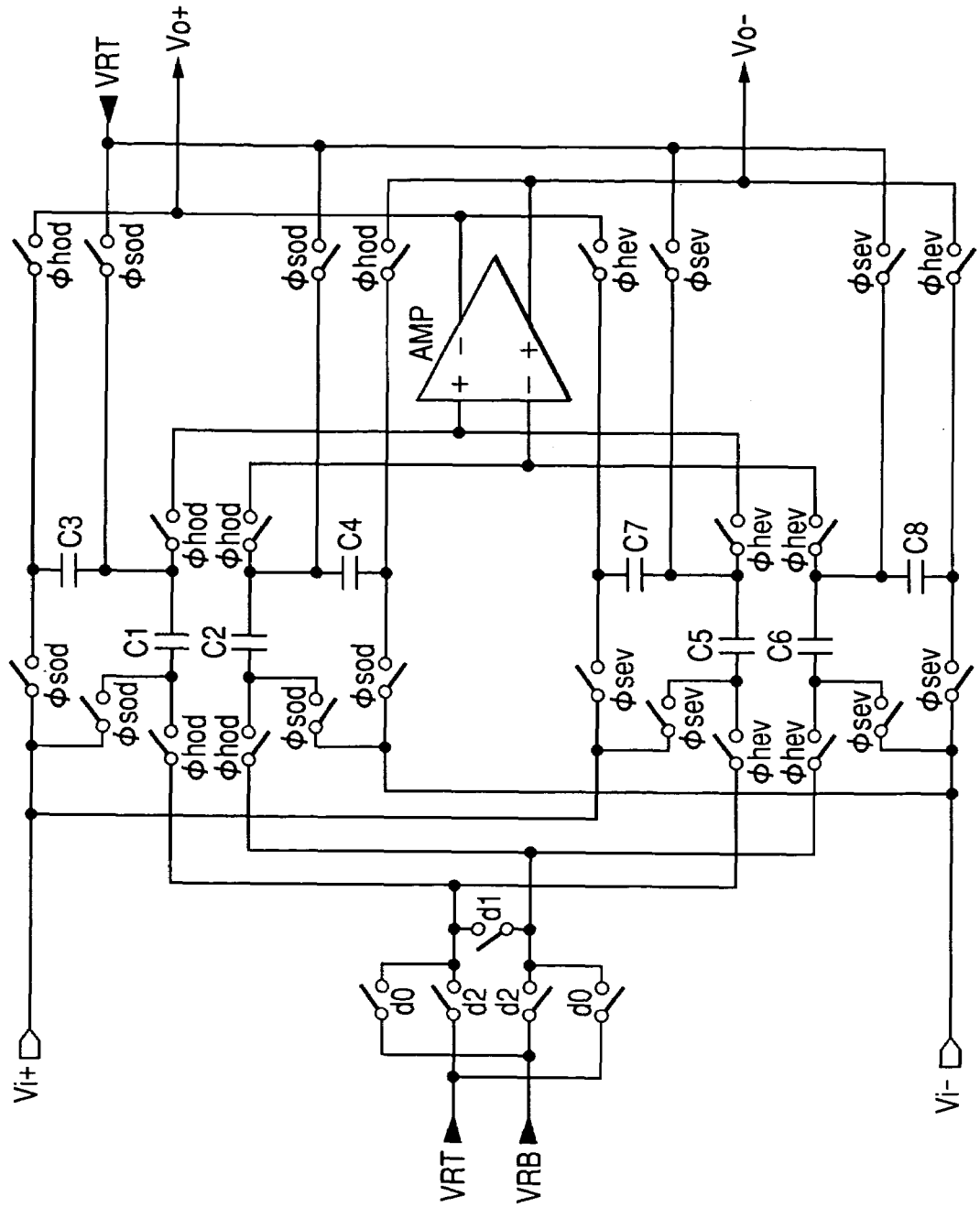
FIG. 3 is a circuit diagram illustrating an embodiment of an interleaved S/H amplifier for use in a pipelined A-D converter according to this invention.

FIG. 3 is a circuit diagram illustrating an embodiment of an interleaved S/H amplifier for use in a pipelined A-D converter according to the present invention. In this embodiment, interleaving is implemented as follows: switch portions are shared between the amplifier main body AMP and the inputs d0 to d2 of a DAC, and two sets of capacitors are provided and switched by the switches. The amplifier main body AMP is a complete differential amplifier, and has two sets of capacitors C1 to C4 and C5 to C8 that sample and hold input signals, each set comprising four capacitors. First plates of the capacitors C1 and C3 and C5 and C7 are connected with the positive input end (+) of the complete differential amplifier AMP through switches. First plates of the capacitors C2 and C4 and C6 and C8 are connected with the negative input end (−) of the complete differential amplifier AMP through switches.

Figure 4:
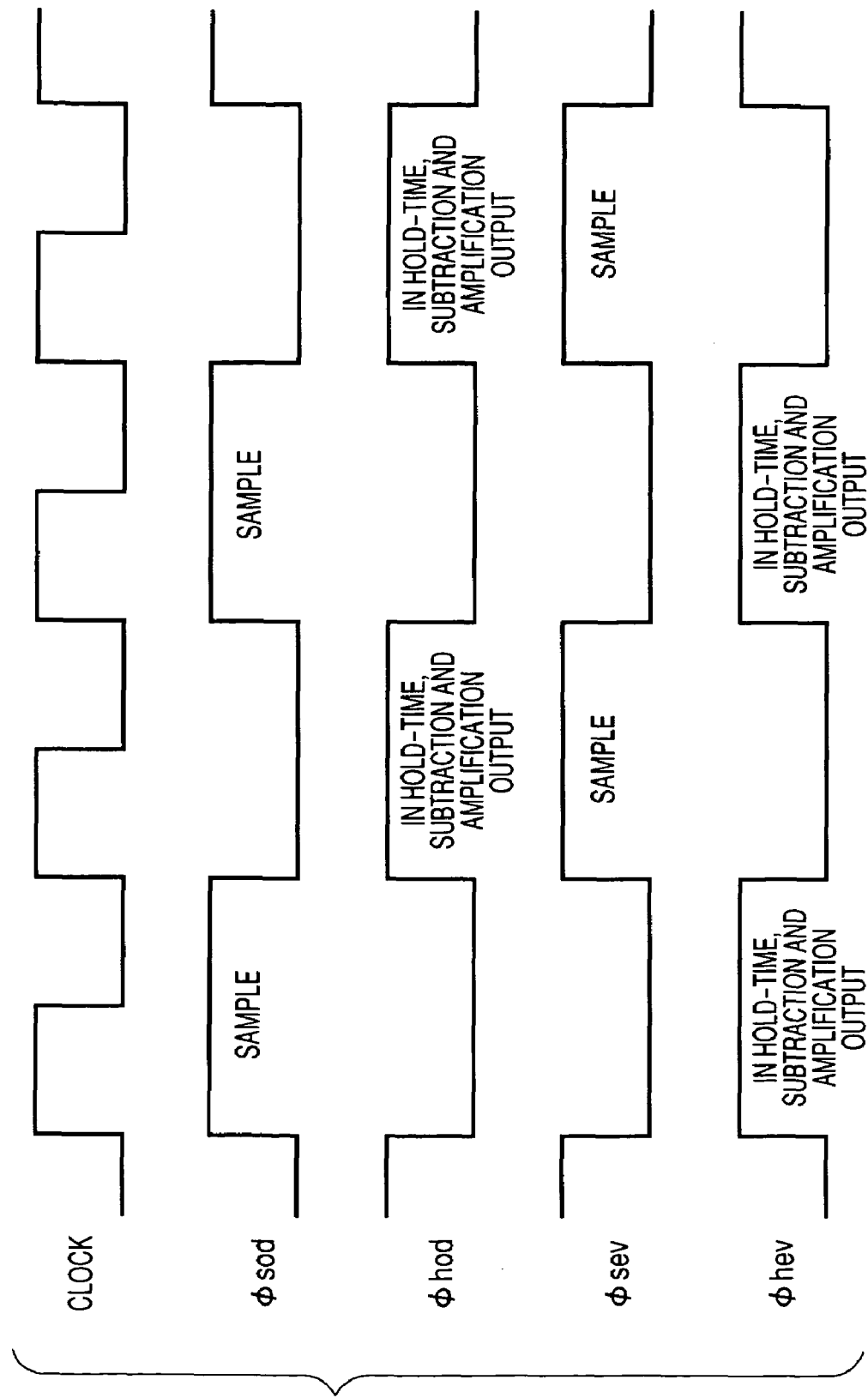
FIG. 4 is a drawing illustrating the operation timing of the S/H amplifier in FIG. 3.

FIG. 4 is a drawing illustrating the operation timing of the S/H amplifier in FIG. 3. Clock signals φsod and φhev, and clock signals φsev and φhod are respectively signals in phase, and clock signals φsod and φhod, and clock signals φsev and φhev are respectively signals in opposite phase. The character s in φsod and φsev indicates sampling pulse, and the character h in φhod and φhev indicates hold pulse. The characters od in φsod and φhod indicate an odd number of interleave, and the characters ev in φsev and φhev indicate even number of interleaved samples.

During sampling on the odd-numbered side (clock signal φsod=1 (high level), and clock signal φhod=0 (low level)), the second plates of the capacitors C1 and C3 are supplied with a positive input signal Vi+; the second plates of the capacitors C2 and C4 are supplied with a negative input signal Vi−. The input ends (+, −) of the complete differential amplifier AMP are biased with a desired voltage VRT.

During sampling on the even-numbered side (clock signal φsev=1 (high level), clock signal φhev=0 (low level)), the second plates of the capacitors C5 and C7 are supplied with a positive input signal Vi+; the second plates of the capacitors C6 and C8 are supplied with a negative input signal Vi−. The input ends (+, −) of the complete differential amplifier AMP are biased with a desired voltage VRT.

During a hold operation on the odd-numbered side (clock signal φsod=0 (low level), clock signal φhod=1 (high level)), a selection is made with respect to the second plates of the capacitors C1 and C2: they are connected with a different reference voltage VRT or VRB, or connected together. Meanwhile, the second plates of the capacitors C3 and C4 are respectively connected with the negative output end (−) and with the positive output end (+) of the complete differential amplifier.

During a hold operation on the even-numbered side (clock signal φsev=0 (low level), clock signal φhev=1 (high level)), a selection is made with respect to the second plates of the capacitors C5 and C6: they are connected with a different reference voltage VRT or VRB, or connected together. Meanwhile, the second plates of the capacitors C7 and C8 are respectively connected with the negative output end (−) and with the positive output end (−) of the complete differential amplifier.

During hold on the odd-numbered side (clock signal φsod=0, clock signal φhod=1), the connecting state of the second plate of each of the capacitors C1 and C2 is selected from among the following three: (a) VRT, VRB, (b) short-circuiting, and (c) VRB, VRT. The DAC function is thereby implemented.

During a hold operation on the even-numbered side (clock signal φsev=0, clock signal φhev=1), the connecting state of the second plate of each of the capacitors C5 and C6 is selected from among the following three: (a) VRT, VRB, (b) short-circuiting, and (c) VRB, VRT. The DAC function is thereby implemented.

The electric charges stored in the capacitors C1 and C2 during sampling on the odd-numbered side are respectively transferred to the capacitors C3 and C4 in accordance with the connecting state selected during hold. Thus, subtraction and amplification are carried out at the same time. Similarly, the electric charges stored in the capacitors C5 and C6 during sampling on the even-numbered side are respectively transferred to the capacitors C7 and C8 in accordance with the connecting state selected during a hold operation. Thus, subtraction and amplification are carried out at the same time.

In the S/H amplifier in this embodiment, the speed of the amplifier is mitigated and lowering of power is accomplished by performing interleave operations. In interleave operations, when either (odd-numbered side or even-numbered side) is performing sampling operations, the other (even-numbered side or odd-numbered side) performs holding operations. That is, when the upper capacitors C1 to C4 are connected with the amplifier main body AMP and carry out amplification, the lower capacitors C5 to C8 are disconnected from the amplifier main body AMP and start sampling. This operation is alternately performed, and as a result, the amplifier AMP constantly carries out amplification. The amplification time is double that of an uninterleaved S/H amplifier. Thus, the speed of the amplifier can be reduced to half, and the consumption current can be reduced.

Figure 5:
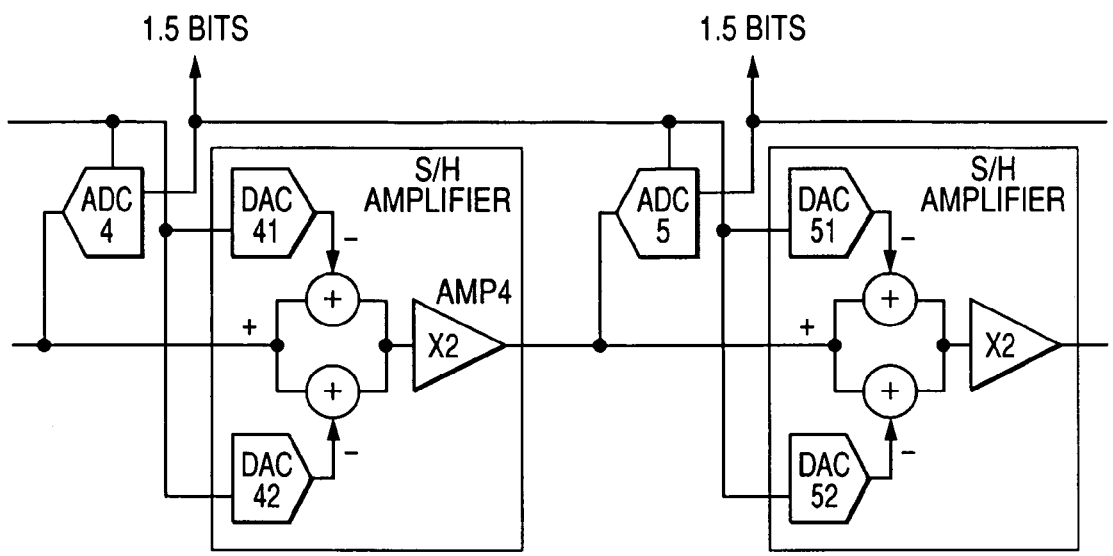
FIG. 5 is a block diagram illustrating another embodiment of interleaved stages for use in a pipelined A-D converter according to this invention.
Figure 6:
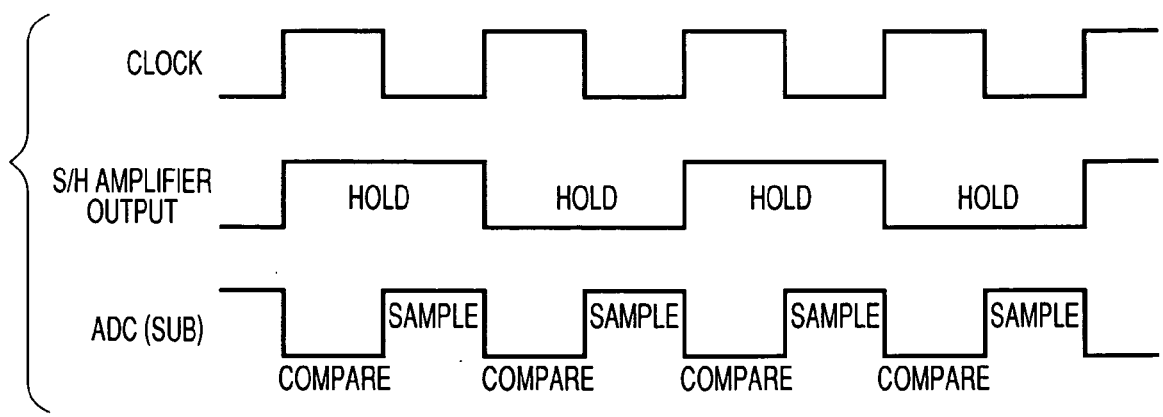
FIG. 6 is a drawing illustrating the operation timing of the stages in FIG. 5.

FIG. 5 is a block diagram illustrating another embodiment of interleaved stages for use in a pipelined A-D converter according to this invention. Unlike the example illustrated in FIG. 1, this embodiment uses sub-ADCs in common. Thus, the circuit can be simplified. As illustrated in the timing chart in FIG. 6, however, the comparator of the sub-ADC starts sampling when the S/H amplifier is performing holding operations. Thus, the comparator of the sub-ADC starts sampling when the S/H amplifier is performing holding operations, and as a result, the output of the S/H amplifier is caused to largely fluctuate. To settle this, it is required to increase the current of the S/H amplifier.

Figure 7:
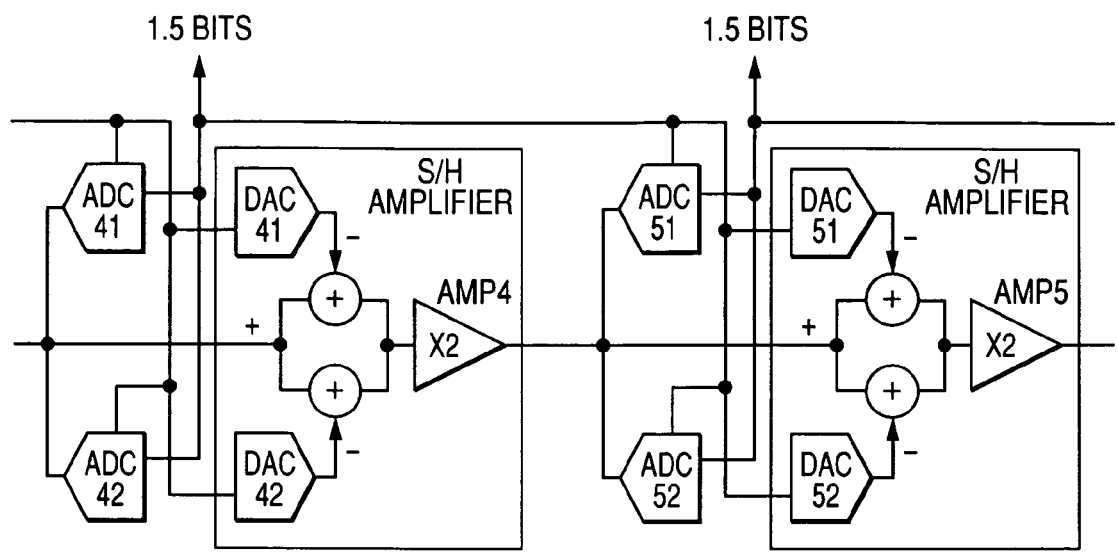
FIG. 7 is a block diagram illustrating a further embodiment of interleaved stages for use in a pipelined A-D converter according to this invention.
Figure 8:
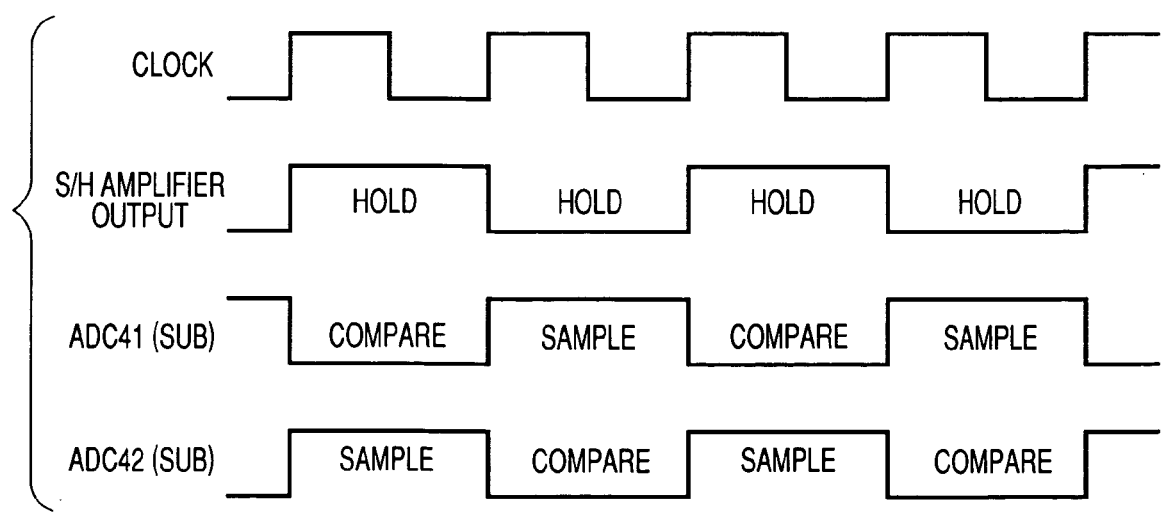
FIG. 8 is a drawing illustrating the operation timing of the stages in FIG. 7.

FIG. 7 is a block diagram illustrating a further embodiment of interleaved stages for use in a pipelined A-D converter according to this invention. This embodiment corresponds to the embodiment illustrated in FIG. 1, and the comparators of the sub-ADCs are also interleaved. Thus, as illustrated in the timing chart in FIG. 8, the hold period of the S/H amplifiers and the sampling period of the comparators are matched with each other, and increase in the current of the S/H amplifiers can be avoided. This interleaving causes the comparators to operate at half speed. Therefore, the current of the comparators can be reduced to half or less, and increase in current due to increase of comparators can be suppressed. That is, the sub-ADC41 (51) and the sub-ADC42 (52) operate at opposite phases, and each of them alternately samples and compares signals, and transmits the result of comparison to the next stage. The sub-ADC41 and the sub-ADC42 operate at speeds equivalent to half of the clock frequency. For this reason, the working speed is reduced to half as compared with cases where only one sub-ADC is provided as in the example illustrated in FIG. 5, and thus the power consumption can be lowered. When the S/H amplifiers are in a hold period, switching between comparing operation and sampling operation does not take place in the sub-ADCs, and thus there is no influence on the output of the S/H amplifiers.

Figure 9:
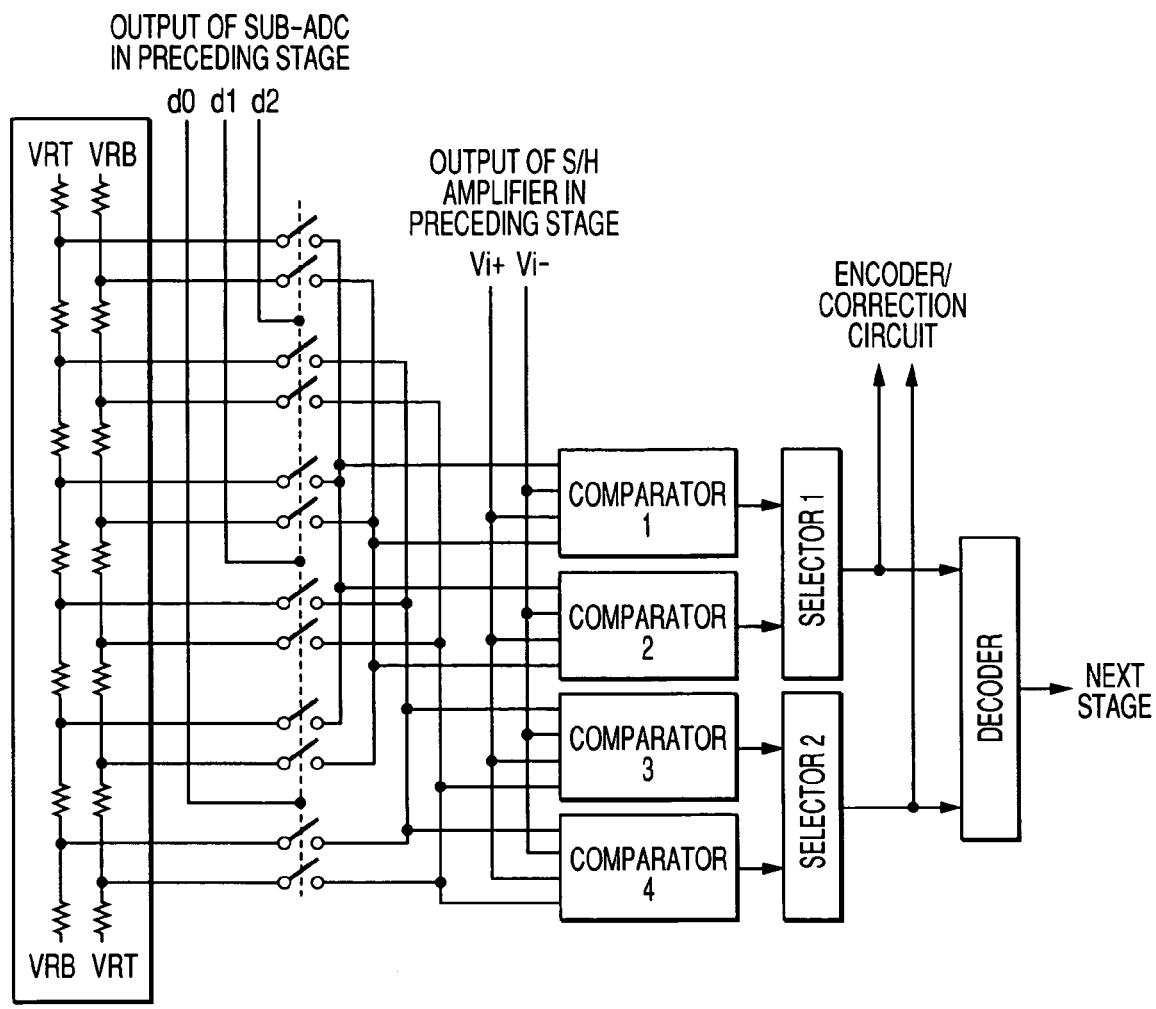
FIG. 9 is a block diagram illustrating an embodiment of an interleaved 1.5-bit sub-ADC for use in this invention.
Figure 10:
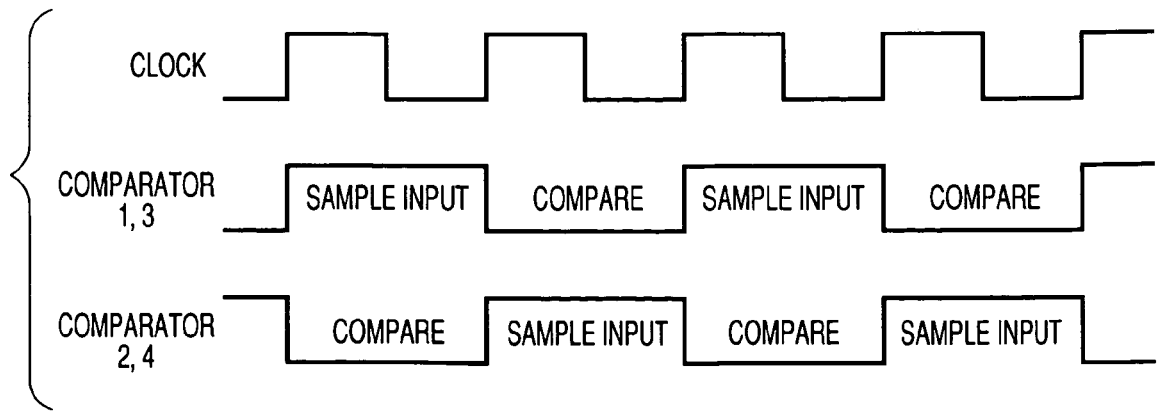
FIG. 10 is a drawing illustrating the operation timing of the sub-ADC in FIG. 9.

FIG. 9 is a block diagram illustrating an embodiment of an interleaved 1.5-bit sub-ADC for use in a pipelined A-D converter according to this invention. FIG. 10 is a drawing illustrating its operation timing. The sub-ADC in this embodiment comprises: a circuit in which the voltage between reference voltages VRT and VRB is divided by ladder resistors formed by connecting resistors in series, and desired reference voltages are generated; switches that select a desired reference voltage from among the generated reference voltages and take them out; four voltage comparators that compare the reference voltage taken out with the differential input signals (Vi+, Vi−) for magnitude; and a decoder that selects the output of the comparator 1 and the comparator 2 and the output of the comparator 3 and the comparator 4, respectively, by a selector 1 and a selector 2, and decodes them to the next stage.

The comparator 1 and the comparator 2, and the comparator 3 and the comparator 4 operate at opposite phases, respectively. The comparator 1 and the comparator 3, and the comparator 2 and the comparator 4 respectively alternately repeat sampling and comparison of signal input to perform interleave operations. Since each of the comparators 1 to 4 operates at speed equivalent to half of the clock frequency, the power consumption can be lowered.

Figure 17:
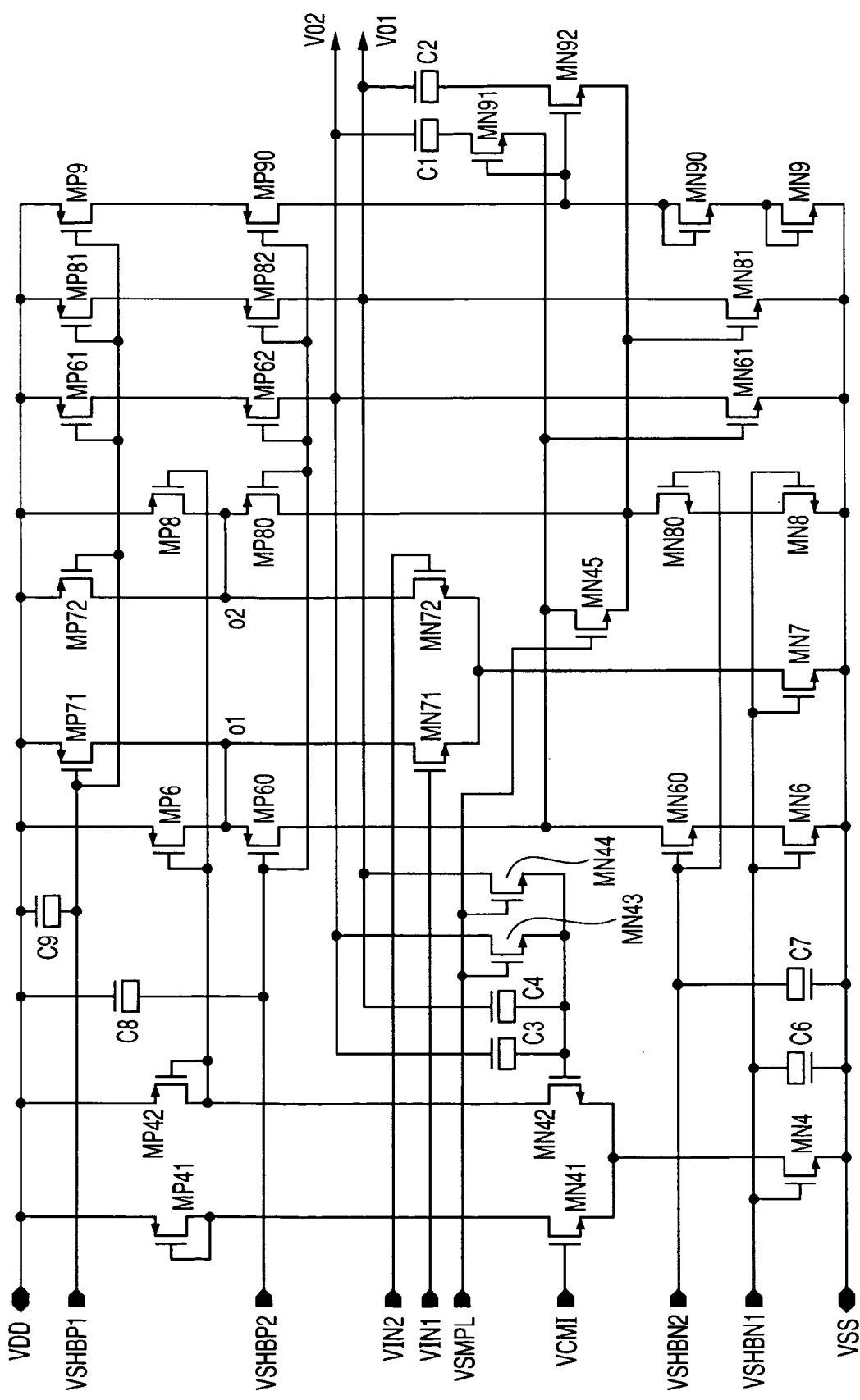
FIG. 17 is a circuit diagram illustrating an embodiment of a differential amplifier used in an S/H amplifier for use in this invention.

FIG. 17 is a circuit diagram illustrating an embodiment of a differential amplifier used in an S/H amplifier for use in this invention. The differential amplifier in this embodiment is a complete differential amplifier that has VIN1 and VIN2 as input signals, and V01 and V02 as outputs. The differential amplifier comprises the first stage of a folded cascode amplifier, an output stage, a common mode feedback amplifier, and a common mode sense circuit. Terminal VCMI is for bias voltage that determines the output center of the differential amplifier, and terminals VSHBN1, VSHBN2, VSHBP1, and VSHBP2 are for bias voltage applied to the current source for the differential amplifier.

The first stage of the differential amplifier is constituted in folded cascode type. It comprises: n-channel MOSFETs MN71 and MN72 to whose gates input signals VIN1 and VIN2 are inputted; an n-channel MOSFET MN7 as a current source provided between their common source and the ground potential VSS of the circuit; p-channel MOSFETs MP71 and MP72 as current source loads placed between drains and supply voltage VDD; p-channel MOSFETs MP6 and MP8; p-channel MOSFETs MP60 and MP80; n-channel MOSFETs MN60 and MN80; and n-channel MOSFETs MN6 and MN8.

The output stage of the differential amplifier comprises: n-channel MOSFETS MN61 and MN81 to whose gates the outputs o3 and o4 of the first stage are inputted; and p-channel MOSFETs MP61, MP81, MP62, and MP82 that make current source loads. The output stage outputs output signals V01 and V02. N-channel MOSFETs MN41, MN42, and MN4 and p-channel MOSFETs MP41 and MP42 constitute a common mode feedback amplifier that determines the output center of the differential amplifier. N-channel MOSFETs MN43 and MN44 and capacitors C3 and C4 constitute a common mode sense circuit that detects the common mode voltage of the differential amplifier output.

When clock signal VSMPL is at high level, the common mode sense circuit short-circuits outputs V01 and V02 by the n-channel MOSFETs MN43 and MN44, and stores the sensed common mode voltages in the capacitors C3 and C4. N-channel MOSFETs MN91 and MN92 and capacitors C1 and C2 are a circuit for phase compensation. The n-channel MOSFETs MN91 and MN92 in the phase compensation circuit are biased with voltage generated by n-channel MOSFETs MN9, MN90, MP9, and MP90.

Figure 18:
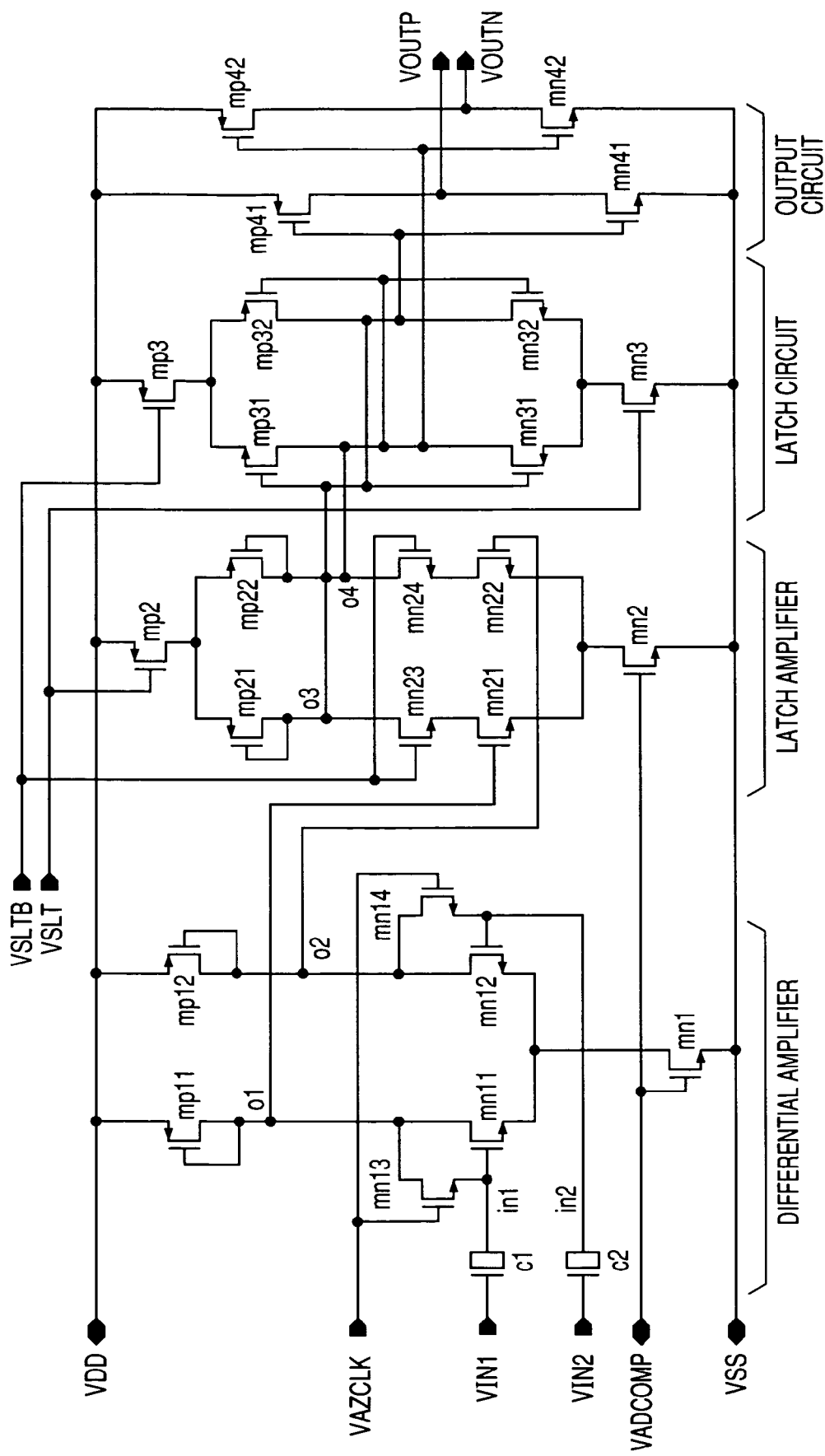
FIG. 18 is a circuit diagram illustrating an embodiment of a voltage comparator used in a sub-ADC for use in this invention.

FIG. 18 is a circuit diagram illustrating an embodiment of a voltage comparator used in a sub-ADC for use in this invention. The voltage comparator in this embodiment comprises a differential amplifier, a latch amplifier, a latch circuit, and an output circuit. It has the following terminals: input VIN1 and VIN2, output VOUTP and VOUTN, clock VAZCLK, VSLT, and VSLTB, and bias VADCOMP. Inputs VIN1 and VIN2 are combined at capacitors C1 and C2 and inputted to the input terminals in1 and in2 of the differential amplifier. The differential amplifier comprises: n-channel MOSFETs mn11 and mn12, n-channel MOSFET mn1 as a current source, and p-channel MOSFETs mp11 and mp12 and n-channel MOSFETs mn13 and mn14 as loads. The differential amplifier outputs output signals o1 and o2 to the latch amplifier.

The latch amplifier has the output signals o1 and o2 inputted. It comprises n-channel MOSFETs mn21, mn22, mn2, mn23, and mn24, and p-channel MOSFETs mp21, mp22, and mp2, and outputs output signals o3 and o4 to the latch circuit.

The latch circuit has the output signals o3 and o4 inputted, and comprises: n-channel MOSFETs mn31, mn32, and mn3 and p-channel MOSFETs mp31, mp32, and mp3. The output circuit comprises n-channel MOSFETs mn41 and mn42 and p-channel MOSFETs mp41 and mp42, and outputs output signals VOUTP and VOUTN.

When signal VAZCLK is at a high level, the differential amplifier has in1 and o1 and in2 and o2 short-circuited by the respective MOSFETs mn13 and mn14, and performs an auto-zero operation. The latch amplifier operates as follows: when signal VSLT is at a low level, the p-channel MOSFET mp2 is brought into on state; when signal VSLTB is at a high level, the n-channel MOSFETs mn23 and mn24 are brought into on state. Thus, it amplifies the output signals o1 and o2 of the differential amplifier, and outputs output signals o3 and o4. The latch circuit operates as follows: when signal VSLTB is at low level, the p-channel MOSFET mp3 is brought into on state; when signal VSLT is at a high level, the n-channel MOSFET mn3 is brought into on state. At this time, it latches the inputs o3 and o4, and outputs VOUTP and VOUTN through the output circuit comprising a CMOS inverter circuit.

Figure 11:
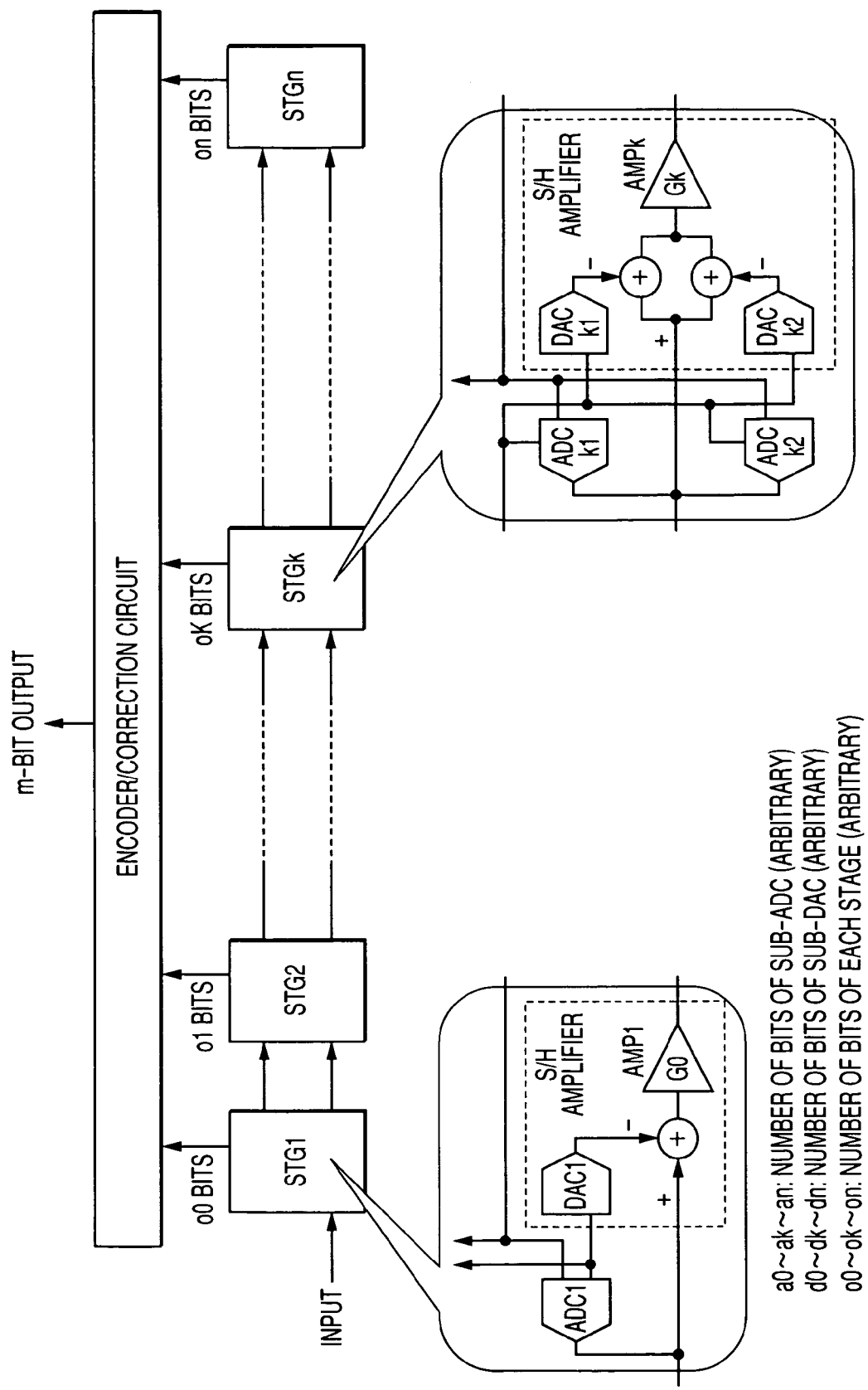
FIG. 11 is a block diagram illustrating another embodiment of a pipelined A-D converter according to this invention.

FIG. 11 is a block diagram illustrating another embodiment of a pipelined A-D converter according to this invention. This embodiment is a pipelined ADC with a resolution of m bits, whose number of pipelined stages is n. Each stage has an arbitrary resolution of o0 to on. The sub-ADC in each stage is of an arbitrary number of bits of a0 to an, and the sub-DAC in each stage is of an arbitrary number of bits of d0 to dn. The S/H amplifier of the sub-ADC in an arbitrary stage of the second and following stages is caused to perform interleave operations.

In the example illustrated in FIG. 1, the sub-ADCs in the intermediate stages are so set that their number of digitized bits is 1.5 bits. The present invention is not limited to this constitution, and an arbitrary number of bits may be adopted as in the example illustrated in FIG. 11. The amplification factor of the amplifiers in the S/H amplifiers is not limited to double, and it may be varied to, for example, G0 to Gk according to the number of bits in digital conversion and the constitution of sub-DACs.

The reference voltage generation circuit in the sub-ADC can be implemented by the following constitution: as in the above embodiment, a plurality of resistors are connected in series between two different types of voltage sources; a switch that is opened or closed according to a digital signal is provided at each junction point between two resistors. The number of types of reference voltage taken out of the junction point is equal to a number obtained by multiplying the number of levels of digital signals by the number of comparators required for A-D conversion. (Examples of the number of levels of digital signals are 3 for 1.5 bits and 4 for 3.2 bits.) (Examples of the number of comparators required for A-D conversion are 2 for 1.5 bits and 3 for 2 bits.)

Figure 12:
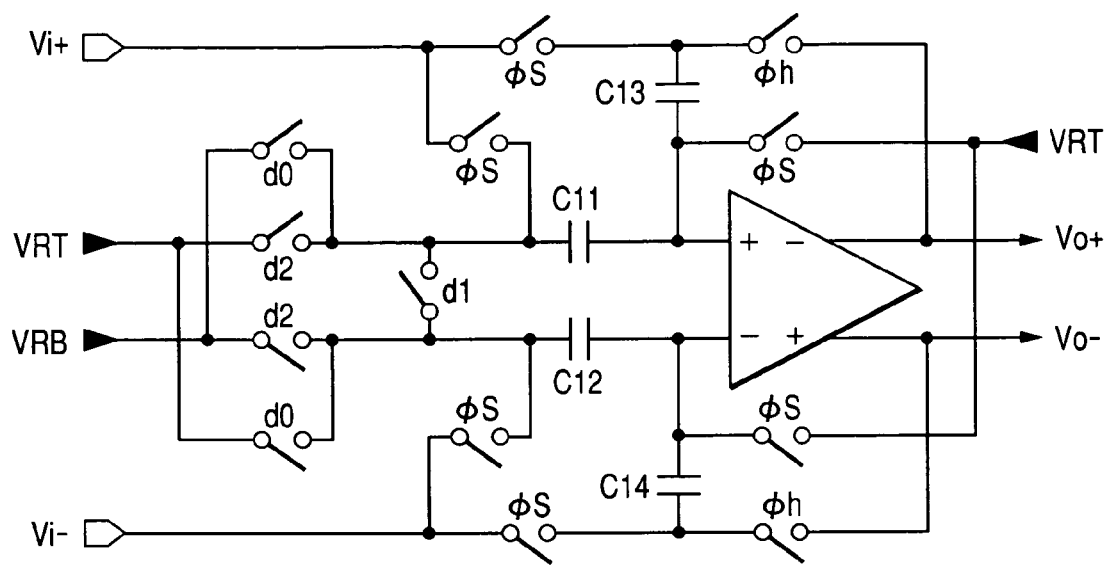
FIG. 12 is a circuit diagram illustrating an embodiment of an uninterleaved S/H amplifier for use in a pipelined A-D converter according to this invention.
Figure 13:
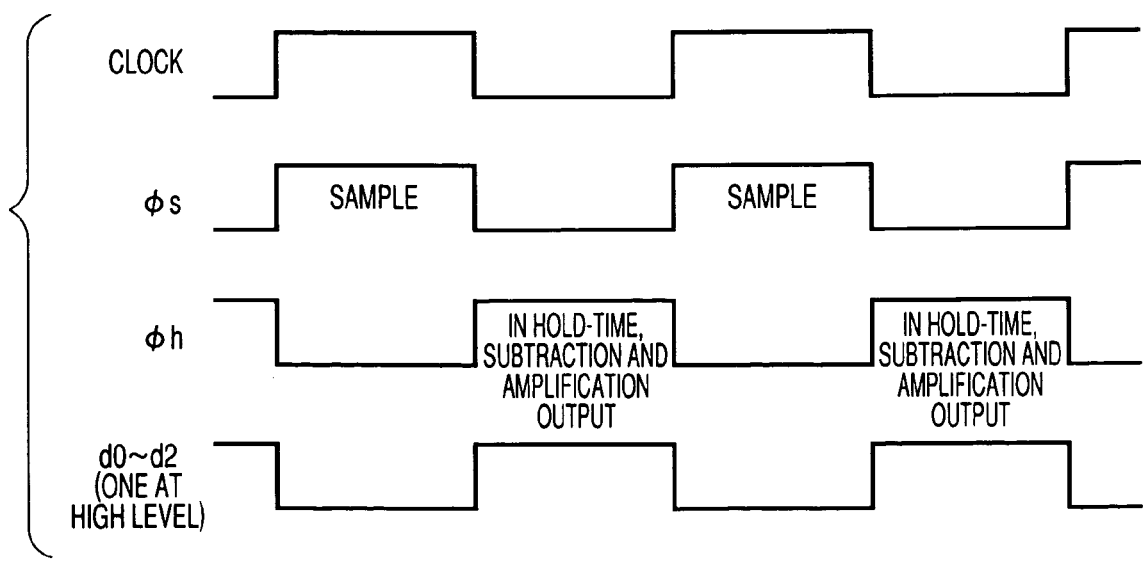
FIG. 13 is a drawing illustrating the operation timing of the S/H amplifier in FIG. 12.

FIG. 12 is a circuit diagram illustrating an embodiment of an uninterleaved S/H amplifier for use in a pipelined A-D converter according to the present invention. FIG. 13 is a drawing illustrating its operation timing. That is, it is used as the S/H amplifier in the second or third stage. In the figure, symbols Vi+ and Vi− respectively denote positive and negative input analog signals; symbols Vo+ and Vo− respectively denote positive and negative output analog signals; symbols C11 to C14 denote capacitors for carrying out subtraction and holding operation; symbol AMP denotes a complete differential operational amplifier; symbols d0, d1, and d2 denote input pulses corresponding to the three levels of input digital signals of 1.5 bits (any one is brought into a high level ("1") and the others are brought into a low level ("0"); symbol φs denotes a sampling pulse; and symbol φh denotes a hold pulse.

D-A conversion and the operation of sampling input analog signals Vi+ and Vi− are carried out by switches supplied with input pulses d0, d1, and d2, a switch supplied with sampling pulse φs, and capacitors. The input pulses d0, d1, and d2 and the sampling pulse φs are in phase with each other. The hold pulse φh is in opposite phase thereto, and when this pulse is at a high level ("1"), subtraction and hold operation are carried out. In order that the output analog signals Vo+ ad Vo− are double the input analog signals Vi+ and Vi−, the capacitors C11, C13, C12, and C14 are so set that C11=C13 and C12=C14. As mentioned above, this circuit operates by switching each capacitor; therefore, it can be designated as switched capacitor type.

Figure 14:
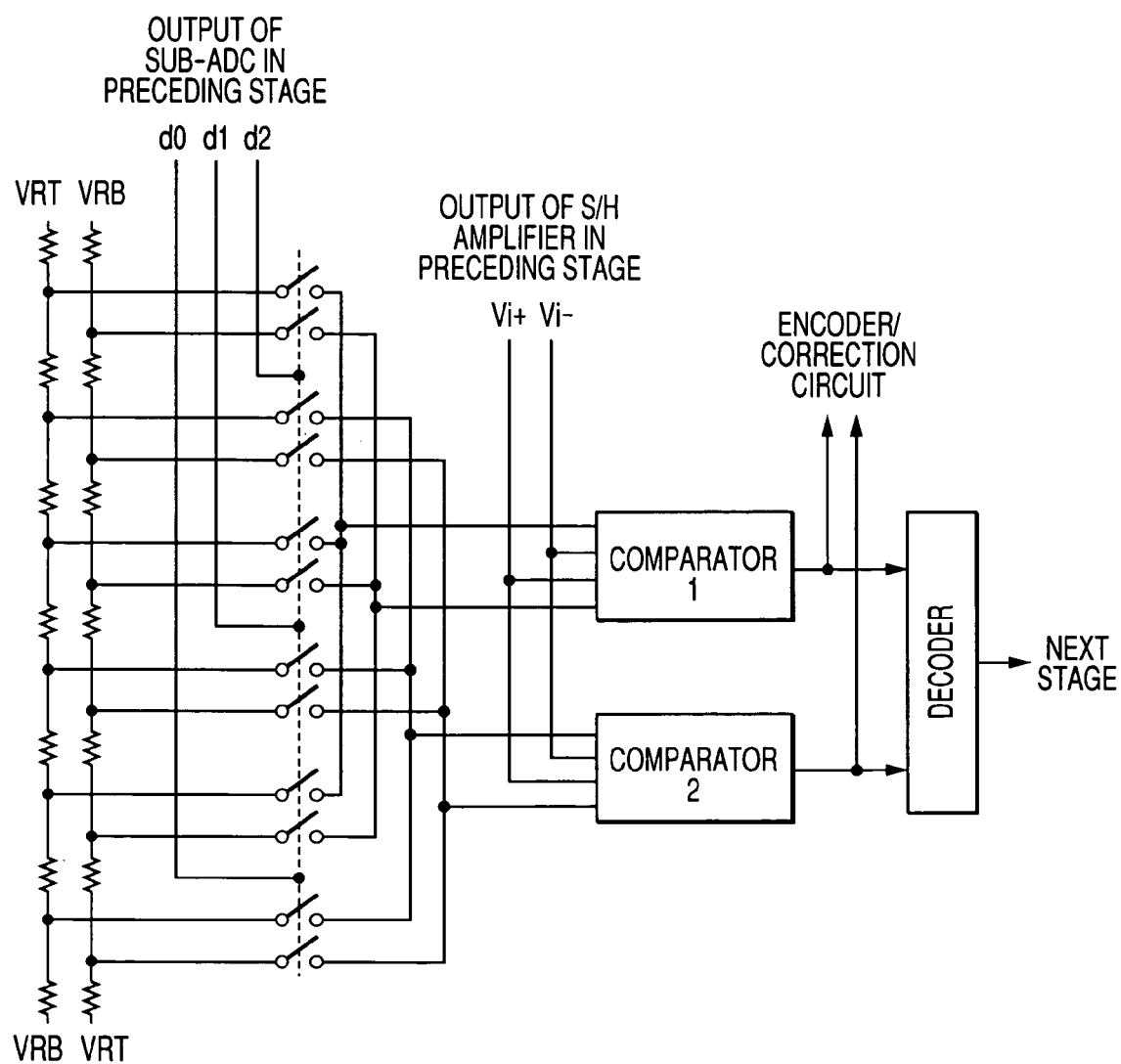
FIG. 14 is a block diagram illustrating an embodiment of an uninterleaved 1.5-bit sub-ADC for use in this invention.

FIG. 14 is a block diagram illustrating an embodiment of an uninterleaved 1.5-bit sub-ADC for use in the present invention. The sub-ADC in this embodiment comprises: a circuit in which the voltage between reference voltages VRT and VRB is divided by ladder resistors formed by connecting resistors in series, and desired reference voltages are generated; switches that select a desired reference voltage from among the generated reference voltages and take them out; two voltage comparators 1 and 2 that compare the reference voltage taken out with the differential input signals (Vi+, Vi−) for magnitude; and a decoder that receives output signals, and decodes them to the next stage.

Figure 15:
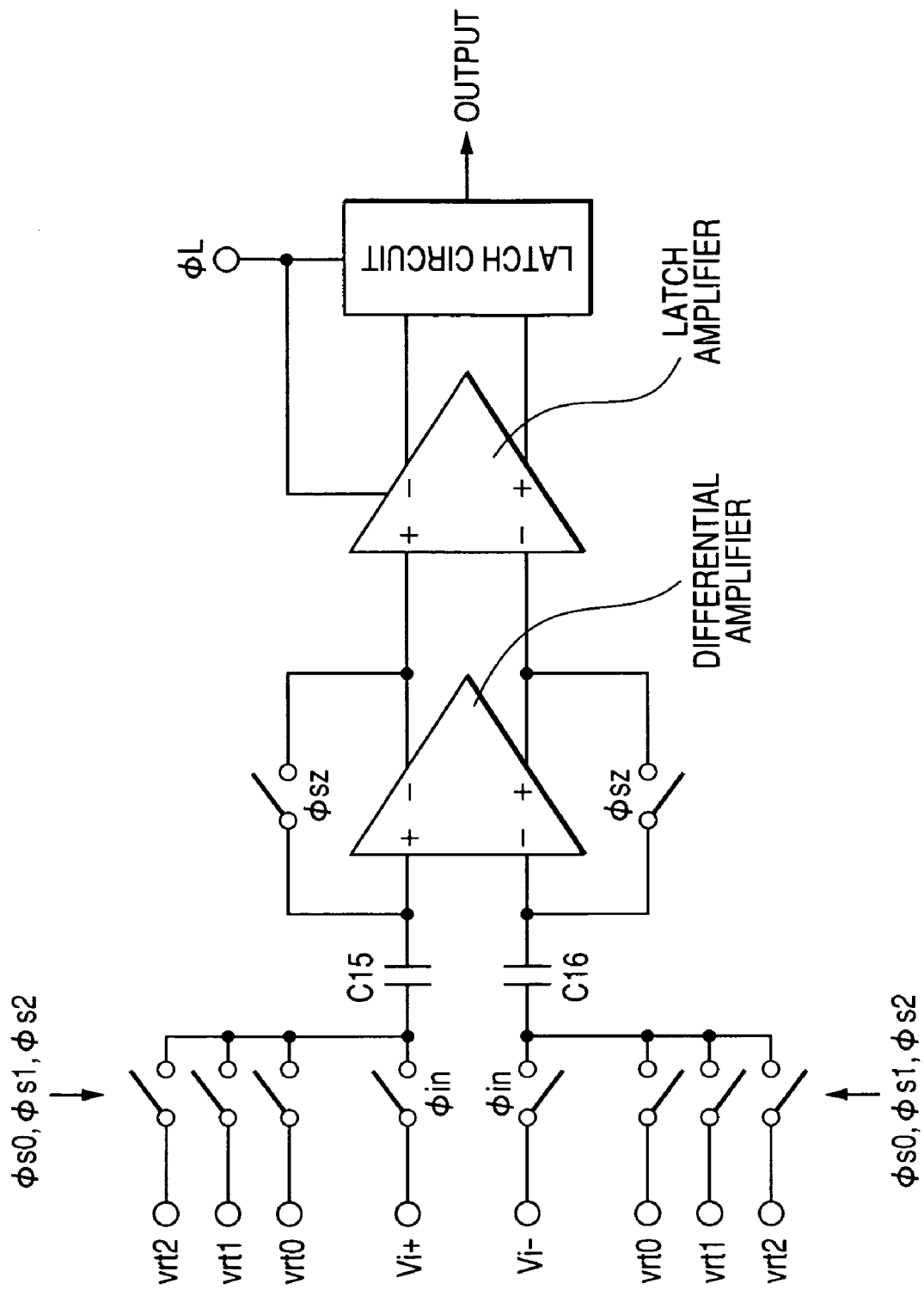
FIG. 15 is a circuit diagram illustrating an embodiment of a voltage comparator for use in this invention.

FIG. 15 is a circuit diagram illustrating an embodiment of a voltage comparator for use in this invention. Voltages vrt0, vrt1, and vrt2 formed by such ladder resistors as illustrated in FIG. 14 are used to compare those corresponding to the outputs d0 to d2 of the sub-ADC in the preceding stage with input voltages (Vi+, Vi−) for magnitude. More specific description will be given. A reference voltage vrt0, vrt1, or vrt2 to be compared is selected in correspondence with the outputs d0 to d2 of the sub-ADC in the preceding stage. The result of comparison of the selected voltage with the input voltages (Vi+, Vi−) is outputted as either a high level or a low level by the comparator. The comparator output is passed to the encoder/correction circuit through the latch amplifier and the latch circuit. Further, it is decoded and passed to the next stage so that it is used as input to the sub-ADC and DAC in the next stage.

The comparator in this embodiment is one designated as chopper type. The differential voltage between the analog signals Vi+ and Vi− and the reference voltage is stored in capacitors C15 and C16 by three types of switches. These switches include: switches supplied with control pulses φin for sampling input analog signals Vi+ and Vi−; a group of switches for selecting the reference voltages vrt0, vrt1, and vrt2; and switches supplied with auto-zero pulses φaz for setting initial conditions. Subsequently, the positive or negative of the voltage is determined by the complete differential amplifier, and comparison operation is thereby performed. The comparison output is amplified by the latch amplifier for the enhancement of sensitivity of comparison.

Figure 16:
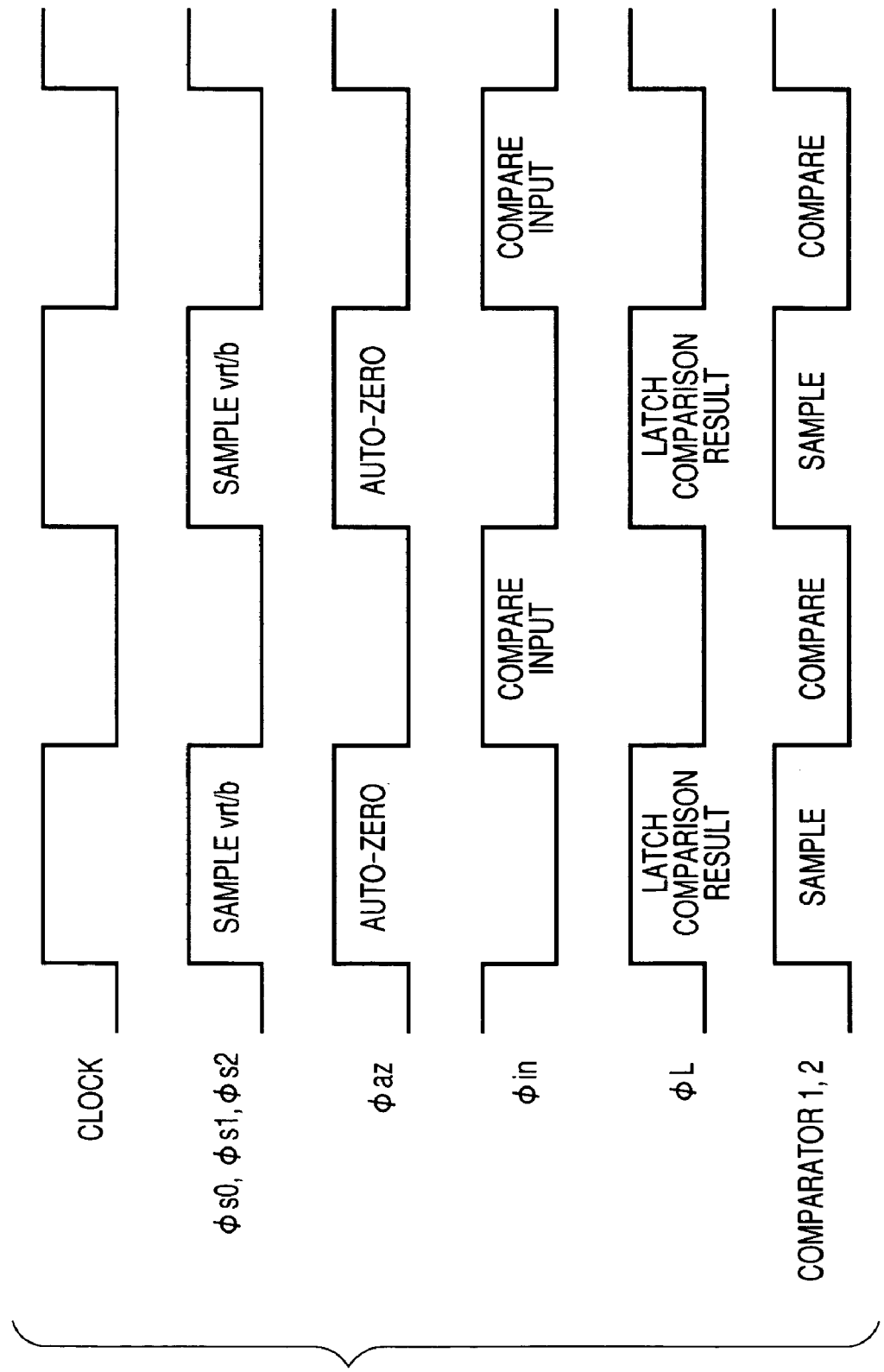
FIG. 16 is a drawing illustrating the operation timing of the voltage comparator in FIG. 15.

As illustrated in the timing chart in FIG. 16, the comparators 1 and 2 in FIG. 14 operate as follows: first, input signals Vi+ and Vi− are respectively sampled in the capacitors C15 and C16 by switches that are turned on by pulse φin. At this time, the input and output of the differential amplifier are short-circuited by switches that are turned on by pulse φaz, and the input and output ends are brought into self-bias voltage. Next, the pulses φin and φaz of signals are varied, and the switches are turned off. Instead, predetermined reference voltages are selected and inputted to the capacitors C15 and C16 by input pulses φs0, φs1, and φs2 that are determined according to the levels of digital signals d0 to d2. Then, input voltages are compared with the reference voltages.

Figure 19:
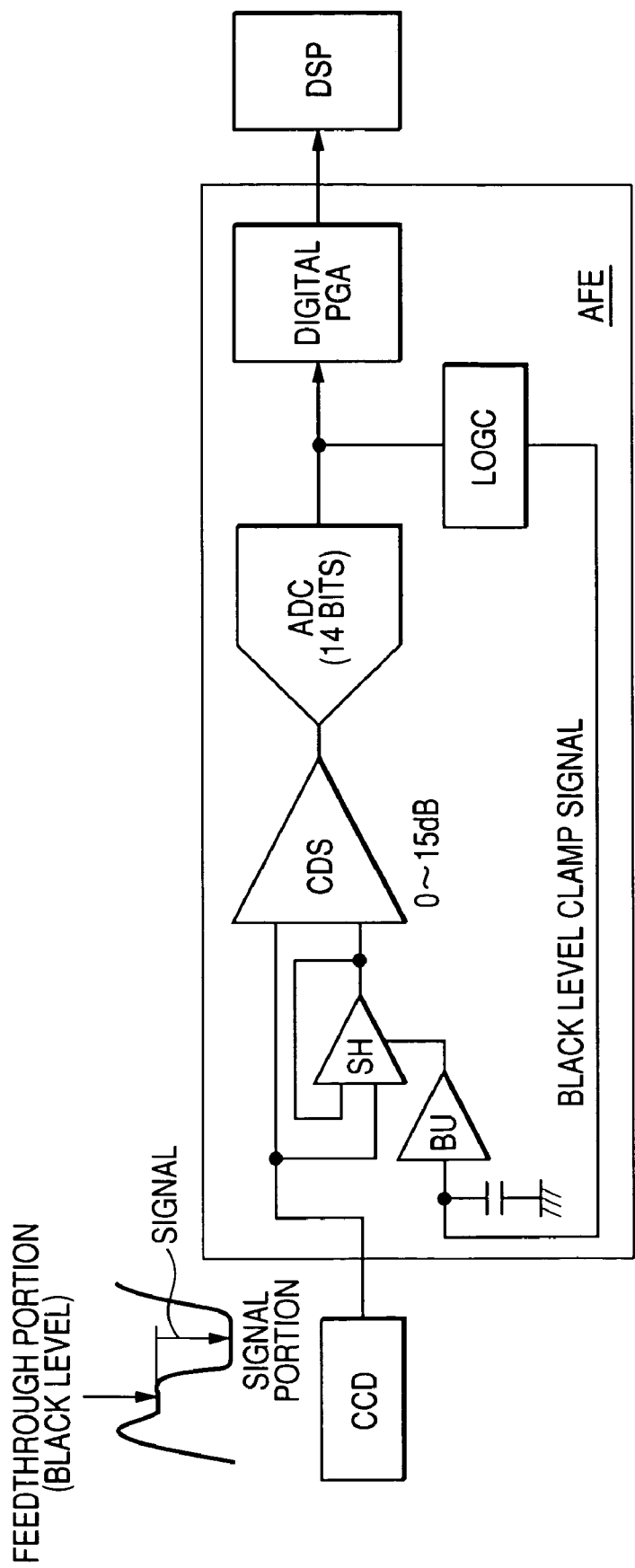
FIG. 19 is a block diagram illustrating an embodiment of a camera preprocessing LSI to which this invention is applied.
Figure 20:
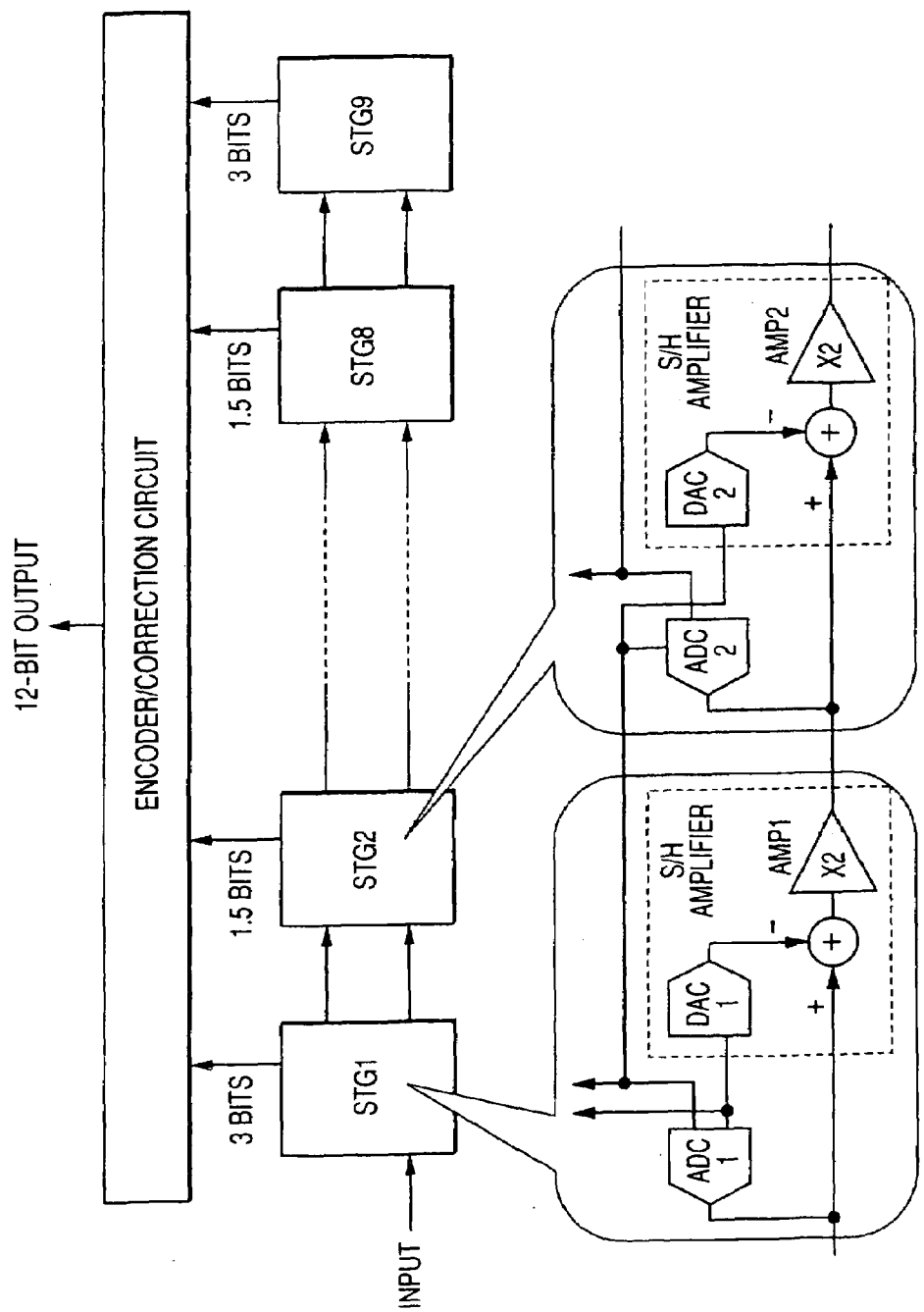
FIG. 20 is a block diagram of a pipelined A-D conversion circuit considered based on Patent Document 1 prior to this invention.

FIG. 19 is a block diagram illustrating an embodiment of a camera preprocessing LSI to which this invention is applied. A pixel signal formed by an image sensor, such as CCD, is sampled as follows: its feedthrough portion representing the black level that serves as the basis for such a pixel signal as illustrated in the drawing of sensor signal waveform in FIG. 19 is sampled by an S/H amplifier. Its signal portion that is a signal formed by the image sensor illustrated in the drawing of sensor signal waveform in FIG. 19 and represents the difference from the feedthrough portion is double sampled by a CDS (Correlated Double Sampling) amplifier. In this embodiment, the signal is digitized with an ADC (14 bits) according to this invention in the stage preceding a PGA (Programmable Gain Amplifier) comprising an analog circuit for the reduction of power consumption. Further, the output of the ADC (14 bits) is amplified by a factor of appropriate gain with the PGA (Programmable Gain Amplifier). The resulting digital signal output is processed at a DSP.

Signals may be processed by a digital signal processing circuit, such as the DSP, that processes this digital signal, in place of the PGA. Thus, the PGA may be omitted from the camera preprocessing LSI chip. When the signal portion is at black level, its voltage is ideally equal to that of the feedthrough portion; however, their voltages do not agree with each other due to the offset of the CCD. Therefore, the black level clamp signal is fed back to the S/H amplifier portion and corrected there. In this embodiment, the power consumption is reduced by interleaving the downstream side of the pipeline A-D converter, and the analog PGA is replaced with the digital PGA. As a result, the power consumption can be significantly reduced, or can be significantly reduced by omission of the PGA in the analog circuit.

In the pipelined A-D converter according to this invention, interleaving is implemented on the downstream side where the accuracy is mitigated. Therefore, degradation in accuracy can be suppressed, and the accuracy can be enhanced. In addition, the S/H amplifiers and sub-ADCs are interleaved, and the speed can be thereby reduced to half. Therefore, the consumption current can be reduced. The power of the ADC that accounts for most of the power consumption of such a camera preprocessing LSI (AFE) as mentioned above can be reduced without sacrificing the accuracy. Therefore, the accuracy of the AFE can be enhanced and further the power consumption can be significantly reduced. The S/H amplifier is interleaved by sharing switch portions between the amplifier main body of the S/H amplifier and the inputs d0 to d2 of the DAC, and providing two sets of capacitors. As a result, the amplifier constantly carries out amplification. If the sample time and the hold time are equal to each other, the amplification time is double that of an uninterleaved S/H amplifier. Thus, the speed of the amplifier can be reduced to half. The speed of an amplifier is in proportion to the self conductance gm of the input transistor of the amplifier, and gm is in proportion to the square root of the current. When the speed is reduced to half, therefore, the current is reduced to ¼.

Figure 21:
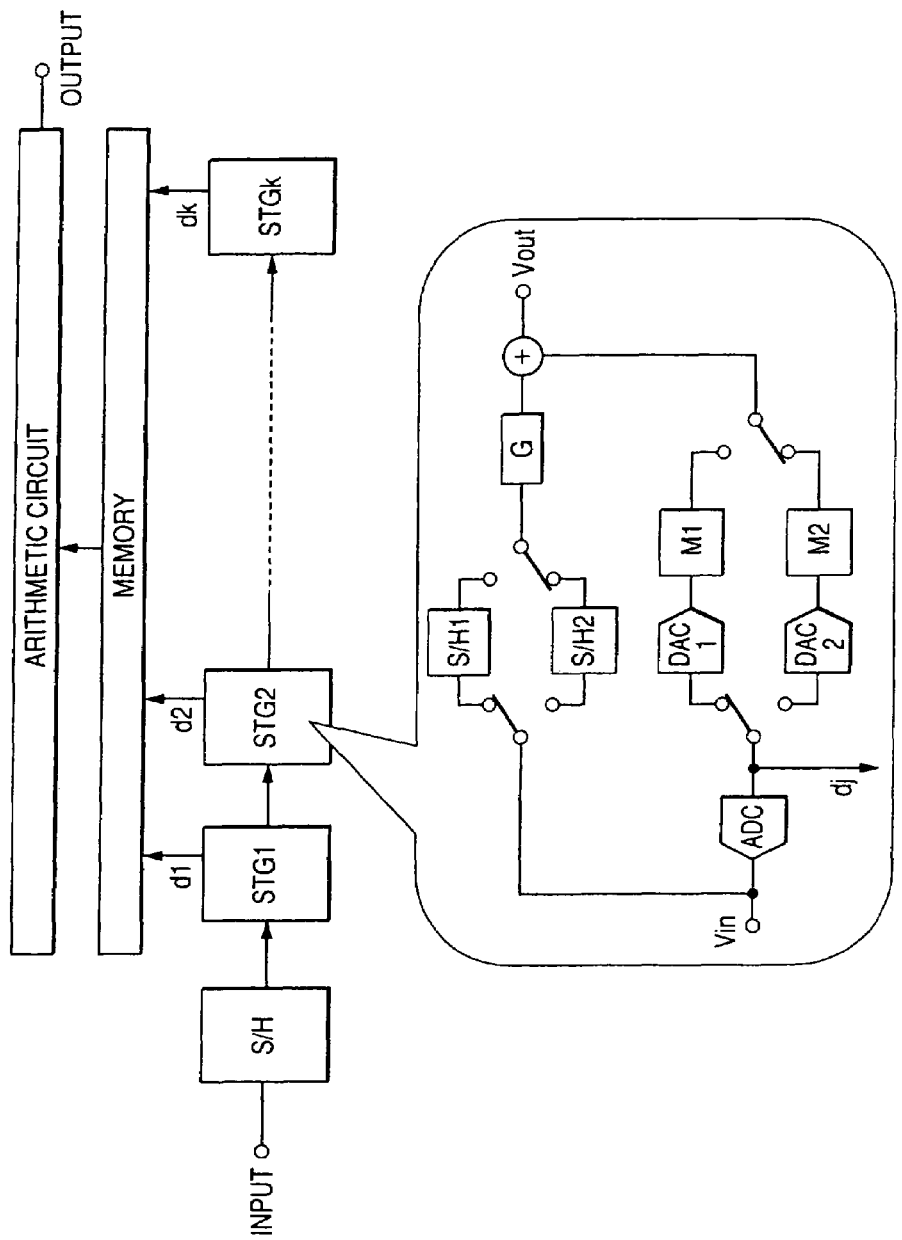
FIG. 21 is a block diagram of a pipelined A-D conversion circuit considered based on Patent Document 2 prior to this invention.

Up to this point, concrete description has been given to the invention made by the present inventors based on the embodiments. However, the present invention is not limited to these embodiments, and various modifications may be made without departing from the spirit and scope thereof. For example, in the constitution illustrated in FIG. 21, two sets of ADCs may be provided so that they are alternately operated when interleaved. Thus, the speed of the amplifiers constituting the ADCs can be reduced to half, and the current can be reduced to ¼. This invention can be utilized in a wide range of applications, including analog front end ICs for portable devices with cameras, digital still cameras, and digital video cameras with a high-accuracy and high-speed pipelined A-D converter built therein, and the like.

What is claimed is:

1. A semiconductor integrated circuit device comprising:
   a pipelined A-D conversion circuit which has a plurality of stages and is coupled in series with an input terminal to which an analog signal to be converted is inputted,
   wherein the stages other than at least one stage, coupled to the input terminal through the one stage, respectively have two or more sample and hold circuits and an amplifier coupled in common with the two or more sample and hold circuits, and the two or more sample and hold circuits perform interleave operations;
   wherein the stages comprise: a sub-A-D converter that carries out A-D conversion to convert an analog signal into a digital signal of a small number of bits; a sub-D-A converter that converts from the digital output signal of the sub-A-D converter to analog; a subtracter that generates a signal indicating the difference between the analog output signal of the sub-D-A converter and the analog signal to be converted; and an amplifier that amplifies, samples, and holds the output signal of the subtracter,
   wherein the sample and hold circuits comprise the sub-D-A converter and the subtracter; and
   wherein the stages in which the interleave operation is performed comprise two or more sample and hold circuits and two or more sub-A-D converters, and the sample and hold circuits and the sub-A-D converters perform synchronous operations.

2. The semiconductor integrated circuit device according to claim 1,
   wherein the amplifier comprises an input terminal 1 and an input terminal 2,
   wherein, when a sampling operation is performed for a signal inputted to the input terminal 1, a holding operation is performed for a signal inputted to the input terminal 2, and
   wherein, when a holding operation is performed for a signal inputted to the input terminal 1, a sampling operation is performed for a signal inputted to the input terminal 2.

3. The semiconductor integrated circuit device according to claim 2,
   wherein the sampling operation and the holding operation are performed in synchronization with the interleave operation.

4. The semiconductor integrated circuit device according to claim 3,
   wherein the sub-D-A converter and the amplifier that performs the sampling operation and holding operation form an integral circuit synthesized using switched capacitors.

5. The semiconductor integrated circuit device according to claim 4, further comprising:
   a correlated double sampling circuit that has a sample and hold circuit receiving the feedthrough portion of a pixel signal formed by a solid-state image sensing device, and receives the signal portion that represents the difference from the feedthrough portion;
   a logic circuit that receives the output signal of the pipelined A-D conversion circuit and feeds a black level clamp signal back to the correlation double sampling circuit; and
   a programmable gain amplifier that receives the output signal of the pipelined A-D conversion circuit and amplifies the output signal by a factor of appropriate gain,
   wherein the output of the correlation double sampling circuit is inputted to the pipelined A-D converter.

6. A semiconductor integrated circuit device comprising:
   a pipelined A-D conversion circuit which has a plurality of stages and is coupled in series with an input terminal to which an analog signal to be converted is inputted,
   wherein the stages respectively have two or more sample and hold circuits, two or more sub-A-D converters, and an amplifier coupled in common with the two or more sample and hold circuits, and
   wherein the two or more sub-A-D converters perform interleave operations.

* * * * *